(12) United States Patent
Min (10) Patent No.: US 8,151,123 B2
(45) Date of Patent: Apr. 3, 2012

(54) CIRCUIT AND METHOD FOR GENERATING AN INTERNAL POWER SUPPLY VOLTAGE

(75) Inventor: Young-Sun Min, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 1245 days.

(21) Appl. No.: 11/841,060

(22) Filed: Aug. 20, 2007

(65) Prior Publication Data

US 2008/0052547 A1   Feb. 28, 2008

(30) Foreign Application Priority Data

Aug. 22, 2006   (KR) .................. 10-2006-0079224

(51) Int. Cl.
*G06F 1/26* (2006.01)

(52) U.S. Cl. ....................... 713/300; 365/226
(58) Field of Classification Search .................. 713/300; 365/226

See application file for complete search history.

(56) References Cited

U.S. PATENT DOCUMENTS

| | | | | |
|---|---|---|---|---|
| 5,224,010 A * | 6/1993 | Tran et al. | ........................ | 361/90 |
| 5,280,455 A * | 1/1994 | Kanaishi | ........................ | 365/229 |
| 6,424,134 B2 * | 7/2002 | Morishita et al. | ............. | 323/313 |
| 6,549,481 B2 * | 4/2003 | McLaury | ...................... | 365/226 |
| 6,885,605 B2 * | 4/2005 | Lee et al. | ........................ | 365/226 |
| 7,130,237 B2 * | 10/2006 | Kwak | ........................... | 365/229 |
| 7,292,090 B2 * | 11/2007 | Lee et al. | ...................... | 327/536 |
| 7,471,578 B2 * | 12/2008 | Kang | ............................. | 365/193 |
| 2002/0024380 A1 * | 2/2002 | Kono | ........................... | 327/541 |
| 2003/0058032 A1 * | 3/2003 | Takagiwa et al. | ............. | 327/540 |
| 2004/0004876 A1 * | 1/2004 | Choi et al. | ..................... | 365/202 |
| 2004/0022115 A1 * | 2/2004 | Park et al. | ..................... | 365/226 |
| 2004/0042319 A1 * | 3/2004 | Lee | ................ | 365/226 |
| 2005/0141321 A1 * | 6/2005 | Kwak | ........................... | 365/229 |
| 2006/0092743 A1 * | 5/2006 | Choi et al. | ..................... | 365/226 |
| 2007/0079055 A1 * | 4/2007 | Chandramouli et al. | ..... | 711/103 |
| 2007/0154034 A1 * | 7/2007 | Mi et al. | ....................... | 381/94.5 |
| 2008/0024203 A1 * | 1/2008 | Lee et al. | ...................... | 327/536 |

FOREIGN PATENT DOCUMENTS

| KR | 10-0408723 | 11/2003 |
|---|---|---|
| KR | 10-0571651 | 4/2006 |
| KR | 10-0576449 | 4/2006 |

\* cited by examiner

*Primary Examiner* — Nitin Patel
*Assistant Examiner* — Zahid Choudhury
(74) *Attorney, Agent, or Firm* — Volentine & Whitt, PLLC (57) ABSTRACT

A circuit and method for generating an internal power supply voltage are disclosed. The circuit includes an internal power supply voltage pre-processing unit configured to generate a first internal power supply voltage in response to an external power supply voltage in a power-up mode and a deep power-down (DPD) exit mode to provide the first internal power supply voltage to an output node, and further configured to define a transition time for the first internal power supply voltage, an internal power supply voltage generating unit configured to generate a stable second internal power supply voltage in response to the external power supply voltage to provide the second internal power supply voltage to the output node, and an initialization signal generating unit configured to generate an internal initialization signal in response to the first internal power supply voltage and the second internal power supply voltage.

22 Claims, 9 Drawing Sheets

CIRCUIT AND METHOD FOR GENERATING AN INTERNAL POWER SUPPLY VOLTAGE

CROSS-REFERENCE TO RELATED APPLICATIONS

This application claims priority under 35 USC §119 to Korean Patent Application No. 10-2006-0079224 filed on Aug. 22, 2006, the subject matter of which is hereby incorporated by reference.

BACKGROUND OF THE INVENTION

1. Field of the Invention

The present invention relates to a semiconductor memory device. More particularly, the invention relates to a circuit and method for generating an internal power supply voltage in the semiconductor memory device.

2. Description of the Related Art

The power supply voltages used in a semiconductor memory device may be provided by an external power supply and/or an internal power supply.

Contemporary semiconductor memory devices intended for use in mobile host devices must be operated in a deep power-down (DPD) mode. While operating in DPD mode, semiconductor memory devices greatly reduce their power consumption. In one aspect, the DPD mode may be used when the external power supply voltage is provided and the internal power supply voltage is turned OFF. That is, when certain portions of the semiconductor memory device are deactivated, they may be placed in the DPD mode and the internal power supply voltage normally supplied to these portions may be turned OFF.

On the other hand, contemporary semiconductor memory devices also include a start mode of some kind. The start mode usually includes a power-up mode and/or a DPD exit mode. The power-up mode enables provision of a power supply voltage to the semiconductor memory device from a state in which both the external and internal power supply voltages are turned OFF. The DPD exit mode enables provision of a power supply voltage to the semiconductor memory device from a state in which the external power supply voltage is provided but the internal power supply voltage is turned OFF.

In a conventional method, the internal power supply voltage is generated from the external power supply voltage using an external initialization signal during the power-up mode. Thereafter, the internal power supply voltage is generated by an internal power supply voltage generator. In such a case, the transition time for generation of the internal power supply voltage is relatively short, and the hold time for an internal initialization signal is also relatively short. As a result, some internal circuits within the semiconductor memory device may not be completely reset during the DPD exit mode.

SUMMARY OF THE INVENTION

In one embodiment, the invention provides a circuit generating an internal power supply voltage, comprising; an internal power supply voltage pre-processing unit configured to generate a first internal power supply voltage in response to an external power supply voltage in a power-up mode and a deep power-down (DPD) exit mode to provide the first internal power supply voltage to an output node, and further configured to define a transition time for the first internal power supply voltage, an internal power supply voltage generating unit configured to generate a stable second internal power supply voltage in response to the external power supply voltage to provide the second internal power supply voltage to the output node, and an initialization signal generating unit configured to generate an internal initialization signal in response to the first internal power supply voltage and the second internal power supply voltage.

In another embodiment, the invention provides a semiconductor memory device, comprising; an internal power supply voltage generating circuit configured to generate an internal power supply voltage in response to an external power supply voltage in a power-up mode and a DPD exit mode and to operate in response to the internal power supply voltage, and further configured to define a transition time for the internal power supply voltage, and an internal circuit configured to be operated in relation to the internal power supply voltage.

In another embodiment, the invention provides a method of generating an internal power supply voltage, comprising; generating a first internal power supply voltage in response to a switch control signal and an external power supply voltage, generating the switch control signal in response to an external initialization signal and a DPD signal, defining a transition time for the first internal power supply voltage in response to the first internal power supply voltage, and generating a second internal power supply voltage in response to the external power supply voltage.

DESCRIPTION OF THE EMBODIMENTS

Embodiments of the invention now will be described with reference to the accompanying drawings. This invention may, however, be embodied in many different forms and should not be construed as limited to only the illustrated embodiments. Rather, the embodiments are presented as teaching examples.

Throughout the drawing and written description, like reference numerals refer to like or similar elements.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
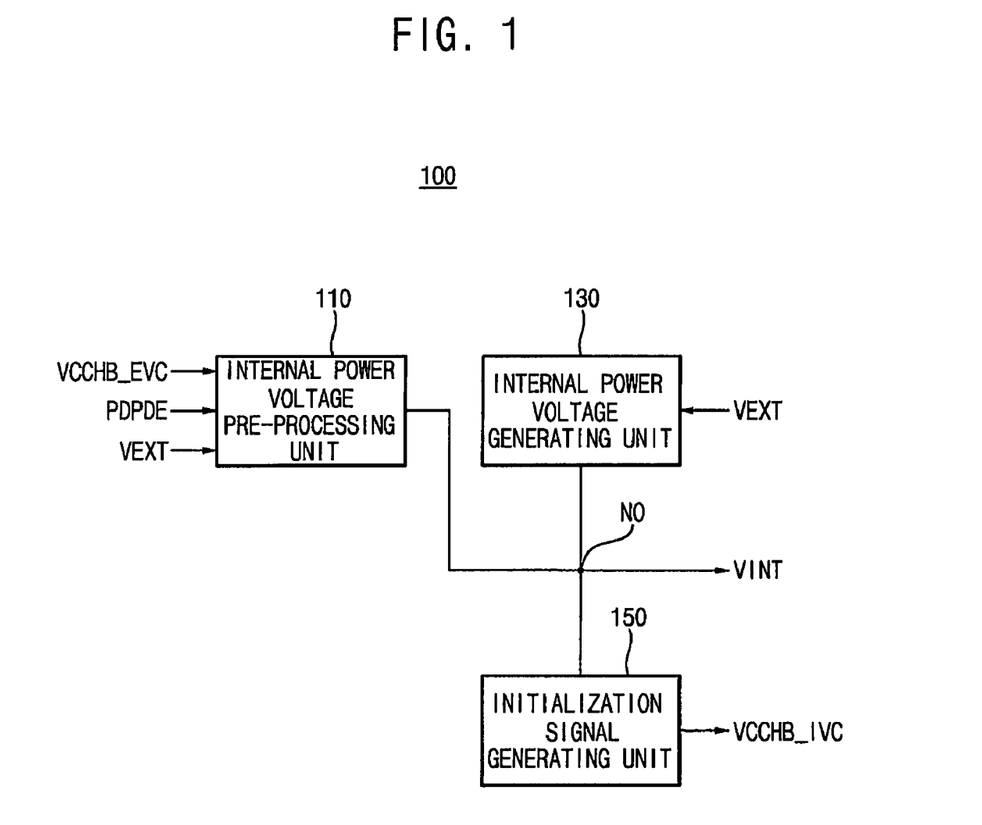
FIG. 1 is a circuit diagram illustrating a circuit generating an internal power supply voltage according to an embodiment of the invention.

FIG. 1 is a circuit diagram illustrating a circuit for generating an internal power supply voltage according to an embodiment of the invention.

Referring to FIG. 1, the internal power supply voltage generating circuit 100 includes an internal power supply voltage pre-processing unit 110, an internal power supply voltage generating unit 130, an initialization signal generating unit 150.

The internal power supply voltage pre-processing unit 110 generates an internal power supply voltage VINT in response to an external power supply voltage VEXT in a power-up mode and a deep power-down (DPD) exit mode, and determines a transition time of the internal power supply voltage VINT.

The internal power supply voltage generating unit 130 generates the internal power supply voltage VINT in response to the external power supply voltage VEXT.

The initialization signal generating unit 150 generates an initialization signal VCCHB_IVC in response to the internal power supply voltage VINT. The internal power supply voltage VINT is provided to an internal circuit (not shown) in a semiconductor memory device through an output node NO.

Figure 2:
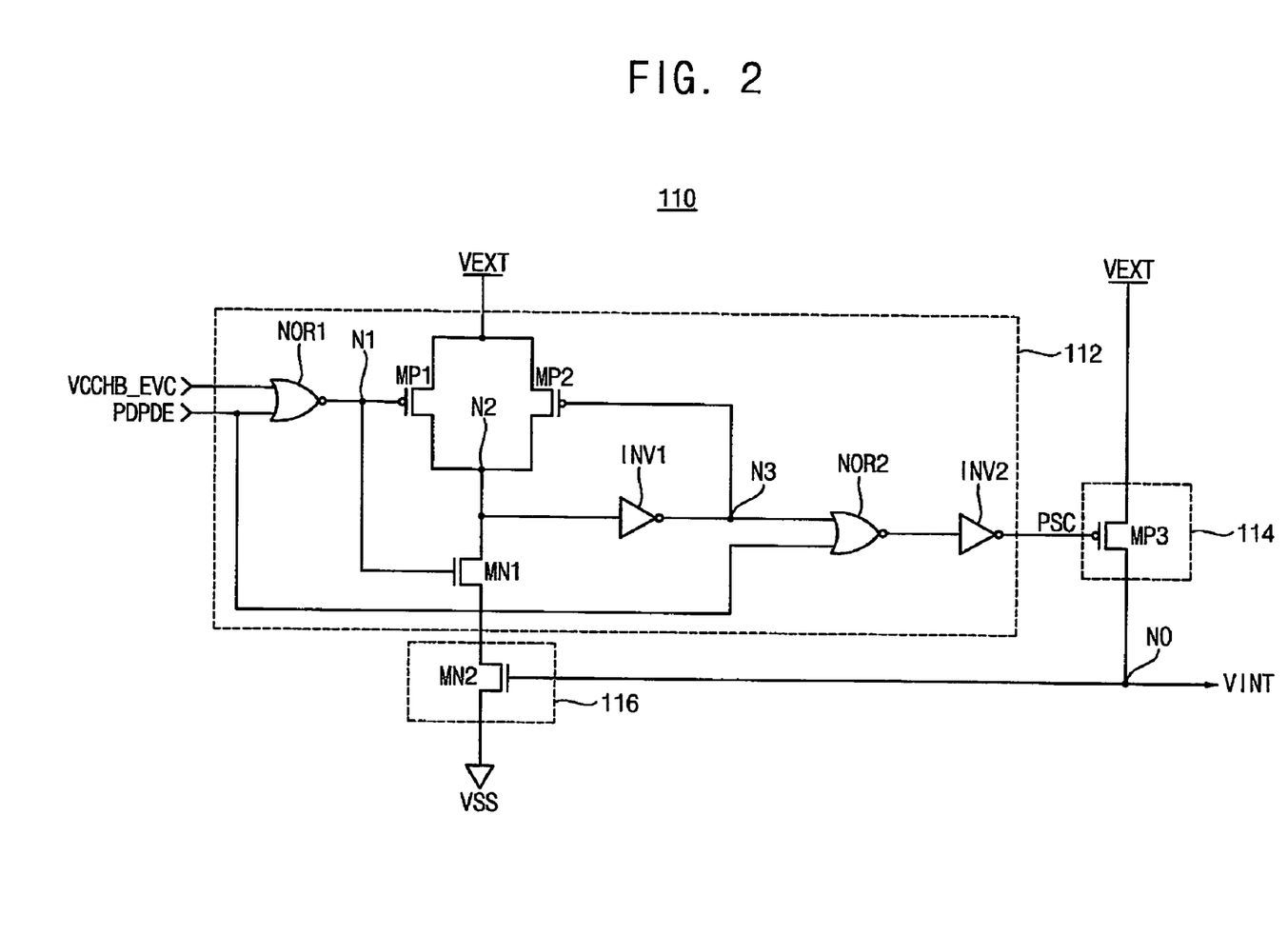
FIG. 2 is a circuit diagram further illustrating the internal power supply voltage pre-processing unit of FIG. 1.

FIG. 2 is a circuit diagram further illustrating the internal power supply voltage pre-processing unit of FIG. 1.

Referring to FIG. 2, the internal power supply voltage pre-processing unit 110 includes a switch control signal generating circuit 112, a switching circuit 114 and a feedback circuit 116.

The switching circuit 114 generates the internal power supply voltage VINT based on the external power supply voltage VEXT in response to a switch control signal PSC, and provides the internal power supply voltage VINT to the node NO.

The switch control signal generating circuit 112 generates the switch control signal PSC in response to an external initialization signal VCCHB_EVC and a DPD signal PDPDE.

The feedback circuit 116 is coupled to the switch control signal generating circuit 112 and operates in response to the internal power supply voltage VINT. The feedback circuit 116 determines a transition time of the internal power supply voltage VINT.

The switching circuit 114 may include a P-type metal-oxide semiconductor (PMOS) transistor MP3. The PMOS transistor MP3 includes a source to which the external power supply voltage VEXT is applied, a gate to which the switch control signal PSC is applied, and a drain coupled to the node NO.

The feedback circuit 116 may include an N-type MOS (NMOS) transistor MN2. The NMOS transistor MN2 includes a gate to which the internal power supply voltage is applied, and a source to which a ground voltage VSS is applied.

The switch control signal generating circuit 112 may include NOR gates NOR1 and NOR2, PMOS transistors MP1 and MP2, an NMOS transistor MN1, and inverters INV1 and INV2.

The NOR gate NOR1 performs a NOR operation on the external initialization signal VCCHB_EVC and the DPD signal PDPDE. An output signal of the NOR gate NOR1 is provided to a node N1. The PMOS transistor MP1 includes a gate that is coupled to the node N1, a source to which the external power supply voltage is applied, and a drain that is coupled to a node N2. The NMOS transistor MN1 includes a gate that is coupled to the node N1, a drain that is coupled to the node N2, and a source that is coupled to a drain of an NMOS transistor MN2 included in the feedback circuit 116. The inverter INV1 inverts a signal of the node N2, and an output signal of the inverter INV1 is provided to a node N3. The PMOS transistor MP2 includes a gate that is coupled to the node N3, a source to which the external power supply voltage VEXT is applied, and a drain that is coupled to the node N2. The NOR gate NOR2 performs a NOR operation on a signal of the node N3 and the DPD signal PDPDE. The inverter INV2 inverts an output signal of the NOR gate NOR2 to output the switch control signal PSC.

The feedback circuit 116 may include the NMOS transistor MN2. The NMOS transistor MN2 includes a gate to which the internal power supply voltage VINT is applied, a drain that is coupled to a source of the NMOS transistor MN1, and a source to which the ground voltage VSS is applied. The NMOS transistor MN1 is included in the switch control signal generator 112.

Figure 3:
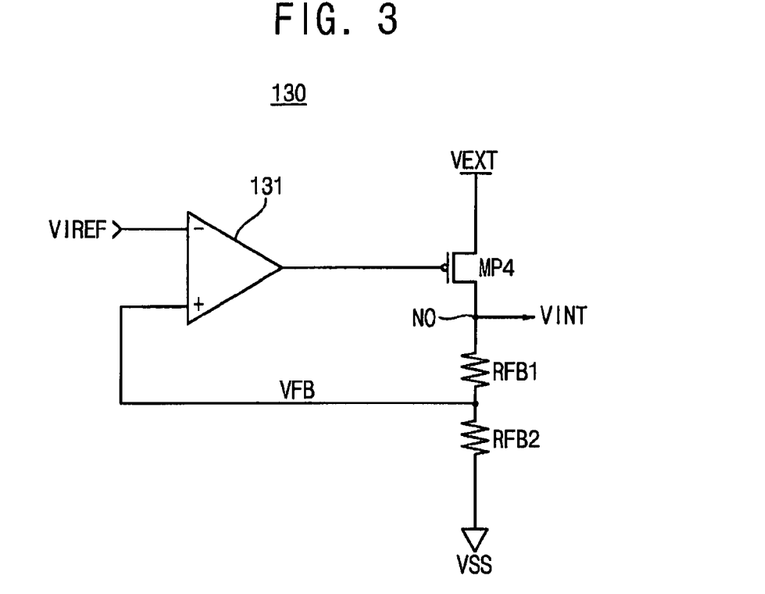
FIG. 3 is a circuit diagram further illustrating the internal power supply voltage generating unit of FIG. 1.

FIG. 3 is a circuit diagram further illustrating the internal power supply voltage generating unit of FIG. 1.

Referring to FIG. 3, the internal power supply voltage generating unit 130 includes a differential amplifier 131, a PMOS transistor MP4, and resistors RFB1 and RFB2.

The differential amplifier 131 amplifies a difference signal between a reference voltage VIREF and a feedback signal VFB. The PMOS transistor MP4 includes a gate that is coupled to an output terminal of the differential amplifier 131, a source to which the external power supply voltage VEXT is applied, and a drain that is coupled to the node NO. A voltage of the node NO corresponds to the internal power supply voltage VINT. The feedback signal VFB is generated by dividing the internal power supply voltage VINT through resistors RFB1 and RFB2.

For example, the external power supply voltage VEXT may correspond to about 1.8 V and the internal power supply voltage VINT may correspond to about 1.45 V.

Figure 4:
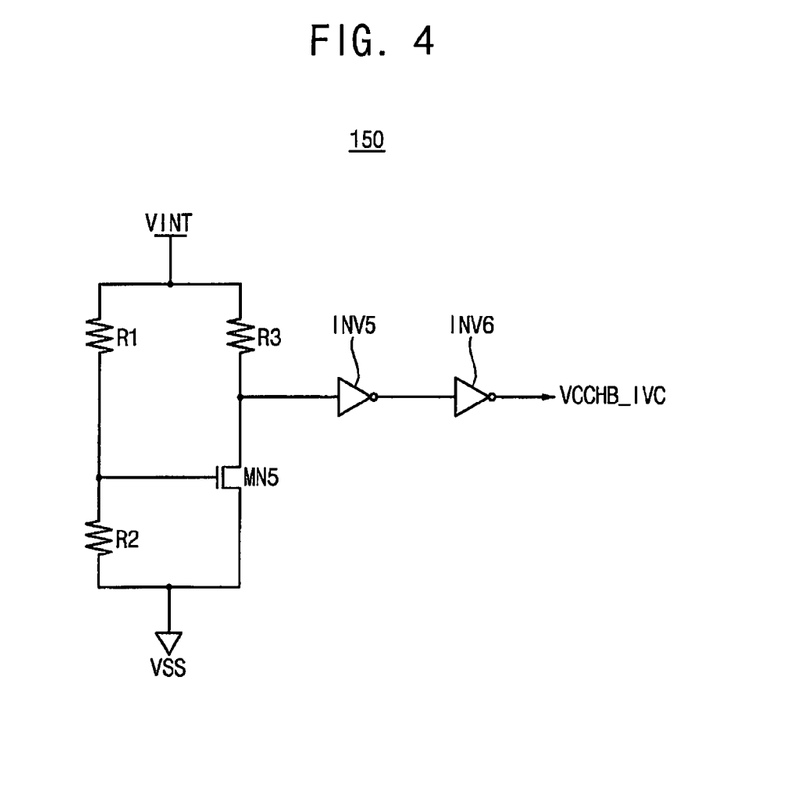
FIG. 4 is a circuit diagram further illustrating the initialization signal generating unit of FIG. 1.

FIG. 4 is a circuit diagram further illustrating the initialization signal generating unit of FIG. 1.

Referring to FIG. 4, the initialization signal generating unit 150 includes resistors R1, R2 and R3, an NMOS transistor MN5, and inverters INV5 and INV6. The resistor R1 includes a first terminal to which the internal power supply voltage VINT is applied. The resistor R2 includes a first terminal coupled to a second terminal of the resistor R1 and a second terminal coupled to the ground voltage VSS. The resistor R3 includes a first terminal to which the internal power supply voltage VINT is applied. The NMOS transistor MN5 includes a gate that is coupled to the second terminal of the resistor R1, a drain that is coupled to a second terminal of the resistor R3, and a source to which the ground voltage VSS is applied. The inverter INV5 inverts a signal of the drain of the transistor MN5. The inverter INV6 inverts a signal of the inverter ENV5 to generate an internal initialization signal VCCHB_IVC.

An exemplary operation of the initialization signal generating unit 150 will now be described.

When the internal power supply voltage VINT begins to be increased from about 0 V, a voltage of the drain of the NMOS transistor MN5 begins to be increased. A voltage generated by dividing the internal power supply voltage VINT through the resistors R1 and R2 is applied to the gate of the NMOS transistor MN5. When the voltage of the gate of the NMOS transistor MN5 is substantially equal to a threshold voltage of the NMOS transistor MN5, the NMOS transistor MN5 is turned ON and the voltage of the drain of the NMOS transistor MN5 is pulled down. The internal initialization signal VCCHB_IVC corresponds to a pulse waveform having a short hold time because the internal initialization signal VCCHB_IVC varies in accordance with the voltage of the drain of the NMOS transistor MN5.

Figure 5:
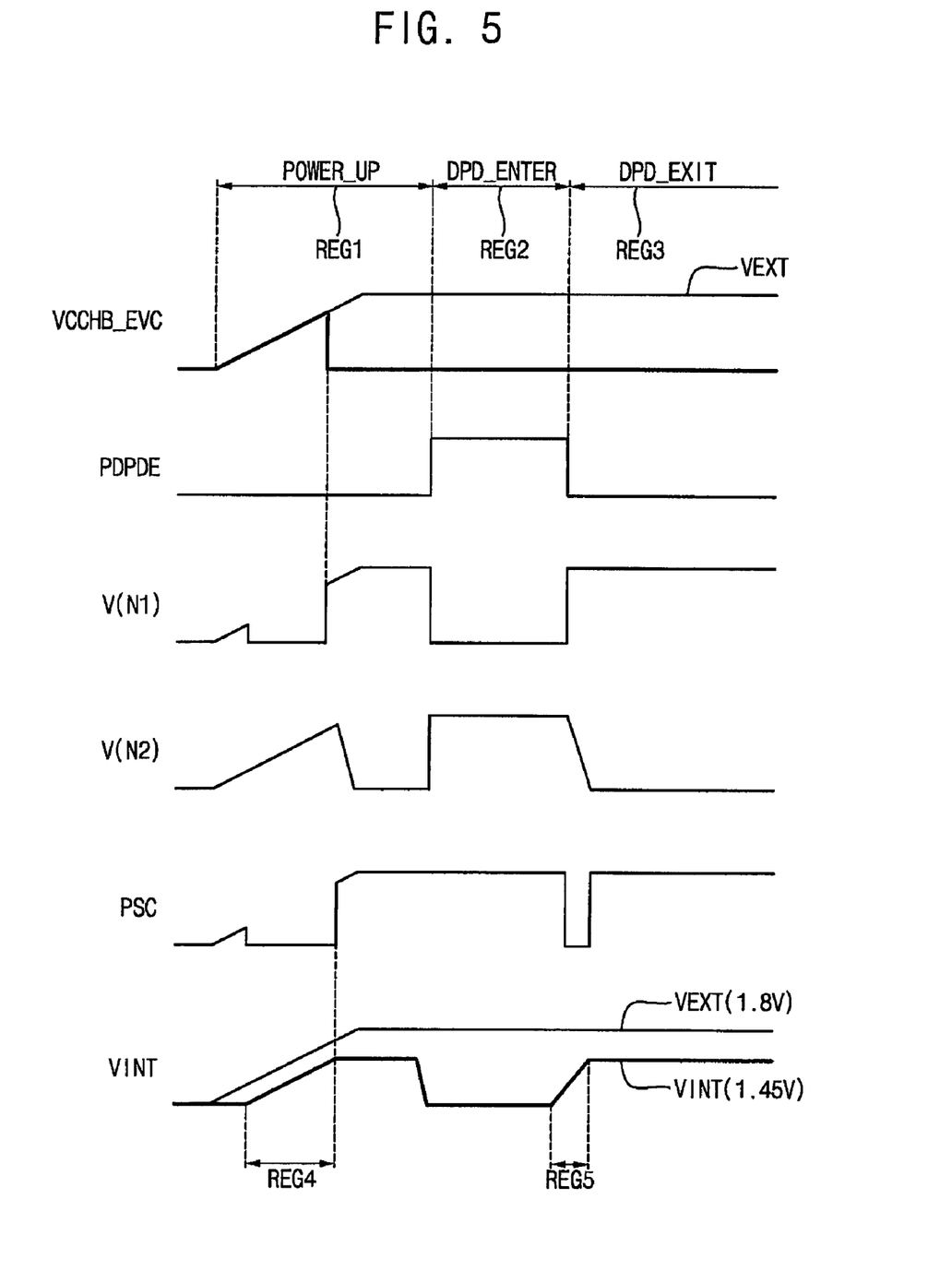
FIG. 5 is a timing diagram illustrating an exemplary operation of the internal power supply voltage pre-processing unit of FIG. 2.

FIG. 5 is a timing diagram illustrating an exemplary operation of the internal power supply voltage pre-processing unit of FIG. 2.

In FIG. 5, REG1 is a power-up section POWER_UP, and REG2 is a DPD enter section DPD_ENTER, and REG3 is a DPD exit section DPD_EXIT. V(N1) is a voltage apparent at node N1 of FIG. 2, and V(N2) is a voltage apparent at node N2 of FIG. 2.

Figure 6:
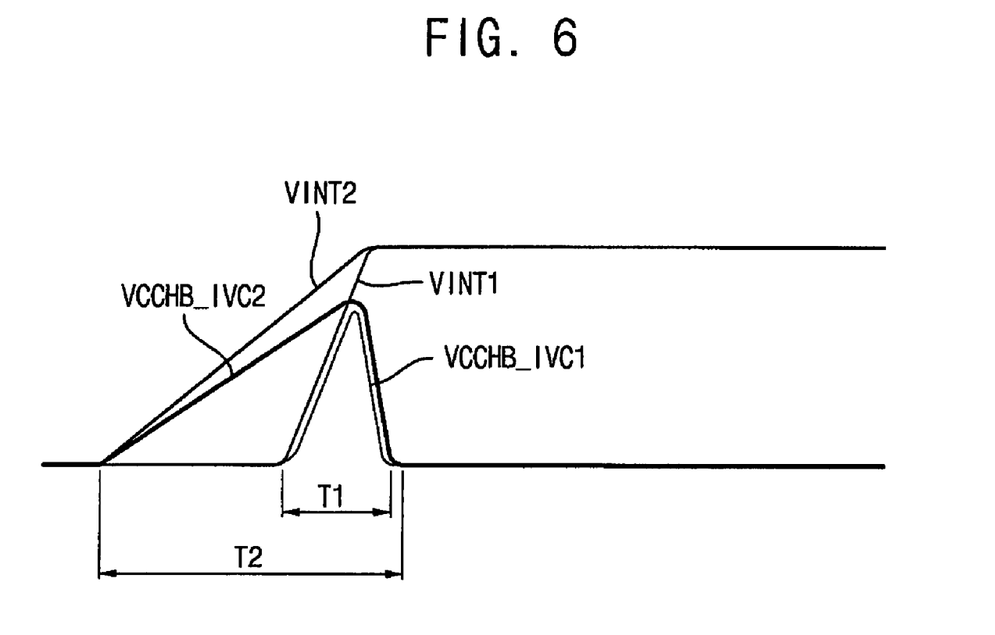
FIG. 6 is a timing diagram illustrating model waveforms for internal power supply voltages and internal initialization signals.

FIG. 6 is a timing diagram for illustrating model waveforms for internal power supply voltages and internal initialization signals. FIG. 6 illustrates the improvement of the internal power supply voltage generating circuit in FIG. 1 over an analogous conventional circuit.

Referring to FIG. 6, plots VINT1 and VCCHB_IVC1 are waveforms of an internal power supply voltage and an internal initialization signal provided by the conventional circuit, and plots VINT2 and VCCHB_IVC2 are waveforms of the internal power supply voltage and the internal initialization signal provided by a circuit consistent with an embodiment of the invention.

An exemplary operation of the internal power supply voltage generating circuit 100 will now be described with reference to FIGS. 1 through 6.

When the external initialization signal VCCHB_EVC is generated, that is, during a power-up mode POWER_UP (i.e., REG1), a voltage signal of the node N1 is logically "low", the PMOS transistor MP1 is turned ON, and a voltage signal of the node N2 is logically "high". A voltage signal of the node N3 is low, and an output signal of the NOR gate NOR2 is high. The switch control signal PSC that corresponds to an output signal of the inverter INV2 is low, and the PMOS transistor MP3 is turned ON. At this time, the external power supply voltage VEXT is provided to the node NO through the PMOS transistor MP3. A voltage of the node NO is the internal power supply voltage VINT, and the node NO is coupled to the internal circuit (not shown).

As illustrated in FIG. 5, when the external power supply voltage VEXT is high, the external initialization signal VCCHB_EVC is high. When the external power supply voltage VEXT reaches a predetermined level, the external initialization signal VCCHB_EVC is pulled down to ground voltage VSS. The external power supply voltage VEXT may be about 1.8 V. When the external initialization signal VCCHB_EVC is low, an output signal of the NOR gate NOR1, that is, the voltage signal apparent at node N1 is high. At this time, the PMOS transistor MP1 is turned OFF, and the NMOS transistor MN2 is turned ON. However, the voltage apparent at node N2 is high and the switch control signal maintains low until the NMOS transistor MN2 is turned ON. When the internal power supply voltage VINT is higher than the threshold voltage of the NMOS transistor MN2, the NMOS transistor MN2 is turned ON. When the NMOS transistor MN2 is turned ON, the voltage signal apparent at node N2 is low and the switch control signal PSC is high. Thus, the PMOS transistor MP3 is turned OFF and the external power supply voltage VEXT is disconnected from the node NO.

Therefore, the internal power supply voltage is not increased and has a fixed value.

An exemplary operation for the internal power supply voltage generating circuit 100 during a DPD exit mode DPD_EXIT (i.e., REG3) will now be described. A DPD signal transitions from high to low during the DPD exit mode DPD_EXIT (i.e., REG3). Referring to FIG. 5, the DPD signal PDPDE is high in the DPD mode DPD_ENTER (i.e., REG2), and the DPD signal PDPDE is low in the DPD exit mode DPD_EXIT (i.e., REG3).

When the DPD signal PDPDE is high, the voltage signal apparent at node N1 is low, the PMOS transistor MP1 is turned ON, and the voltage signal apparent at node N2 is high. The voltage signal apparent at node N3 is low. However the output signal of the NOR gate NOR2 is low because an input signal of the NOR gate NOR2 is high. The switch control signal PSC that corresponds to the output signal of the inverter INV2 is high and the PMOS transistor MP3 is turned OFF. At this time, the external power supply voltage VEXT is disconnected from the node NO.

When the DPD signal PDPDE is low, the output signal of the NOR gate NOR2 is high because one input signal of the NOR gate NOR2 is low, and the voltage signal apparent at node N3 is low. The switch control signal PSC that corresponds to the output signal of the inverter INV2 is low and the PMOS transistor MP3 is turned ON. At this time, the external power supply voltage VEXT is provided to the node NO through the PMOS transistor MP3. Because the DPD signal PDPDE is low, the output signal of the NOR gate NOR1 is high. That is, the voltage signal apparent at node N1 is high. At this time, the PMOS transistor MP1 is turned OFF and the NMOS transistor MN2 is turned ON. However, the voltage apparent at node N2 is high, the voltage apparent at node N3 is low, and the switch control signal PSC maintains a low until the NMOS transistor MN2 is turned ON. When the internal power supply voltage VINT is higher than the threshold voltage of the NMOS transistor MN2, the NMOS transistor MN2 is turned ON. When the NMOS transistor MN2 is turned ON, the voltage apparent at node N2 is low, and the switch control signal PSC is high. Thus, the PMOS transistor MP3 is turned OFF and the external power supply voltage VEXT is disconnected from a node NO. Therefore, the internal power supply voltage maintains a fixed value.

When the threshold voltage of the NMOS transistor MN2 is about 0.7 V, the internal power supply voltage pre-processing unit 110 increases the internal power supply voltage VINT to about 0.7 V, and the internal power supply generating unit 130 increases the internal power supply voltage VINT from about 0.7 V to a saturation voltage.

Therefore, the transition time of the internal power supply voltage VINT is determined based on the threshold voltage of the NMOS transistor MN2 in the feedback circuit 116. The transition time of the internal power supply voltage is a required time for the internal power supply voltage VINT transitioning from about 0 V to the saturation voltage. In one embodiment, the threshold voltage of an NMOS transistor used in the foregoing embodiment is about 0.45 V. Therefore, the threshold voltage of the NMOS transistor MN2 in the feedback circuit 116 is higher than that of normal MOS transistors so that the transition time of the internal power supply voltage VINT is increased. For example, when the width of a gate oxide layer associated with the MOS transistor is increased, its threshold voltage will increase. When the internal power supply voltage VINT is increased, the pulse hold time for the internal initialization signal VCCHB_IVC provided by the initialization signal generating unit 150 is sufficiently long.

Referring to FIG. 5, the transition time for the internal power supply voltage VINT in the DPD exit mode DPD_EXIT (i.e., REG5) is shorter than that of the internal power supply voltage VINT in the power-up mode POWER_UP (i.e., REG4). However, the internal power supply generating circuit 100 illustrated in FIG. 1 generates the internal power supply voltage VINT with a relatively long transition time because the internal power supply generating circuit 100 includes an NMOS transistor having a threshold voltage that is higher than that of typical NMOS transistors. The NMOS transistor is included in the feedback circuit 116. Also, the internal power supply generating circuit 100 illustrated in FIG. 1 generates the internal initialization signal VCCHB_IVC having a pulse hold time T2 for the internal initialization signal VCCHB_IVC that is longer than the conventional pulse hold time T1 shown in FIG. 6.

As illustrated in FIG. 5, the external power supply voltage VEXT may be about 1.8 V and the internal power supply voltage VINT may be about 1.45 V. When the voltage of the node NO in FIG. 1 is higher than the threshold voltage of the NMOS transistor NM2 in the feedback circuit 116, the internal power supply voltage pre-processing unit 110 generates the internal power supply voltage VINT. When the voltage of the node NO in FIG. 1 is lower than the threshold voltage of the NMOS transistor NM2 in the feedback circuit 116, the internal power supply voltage VINT is generated by the internal power supply generating unit 130. That is, when the threshold voltage of the NMOS transistor MN2 is about 0.7 V, the internal power supply voltage pre-processing unit 110 increases the internal power supply voltage VINT until about 0.7 V and the internal power supply generating unit 130 increases the internal power supply voltage VINT from about 0.7 V to a saturation voltage.

Figure 7:
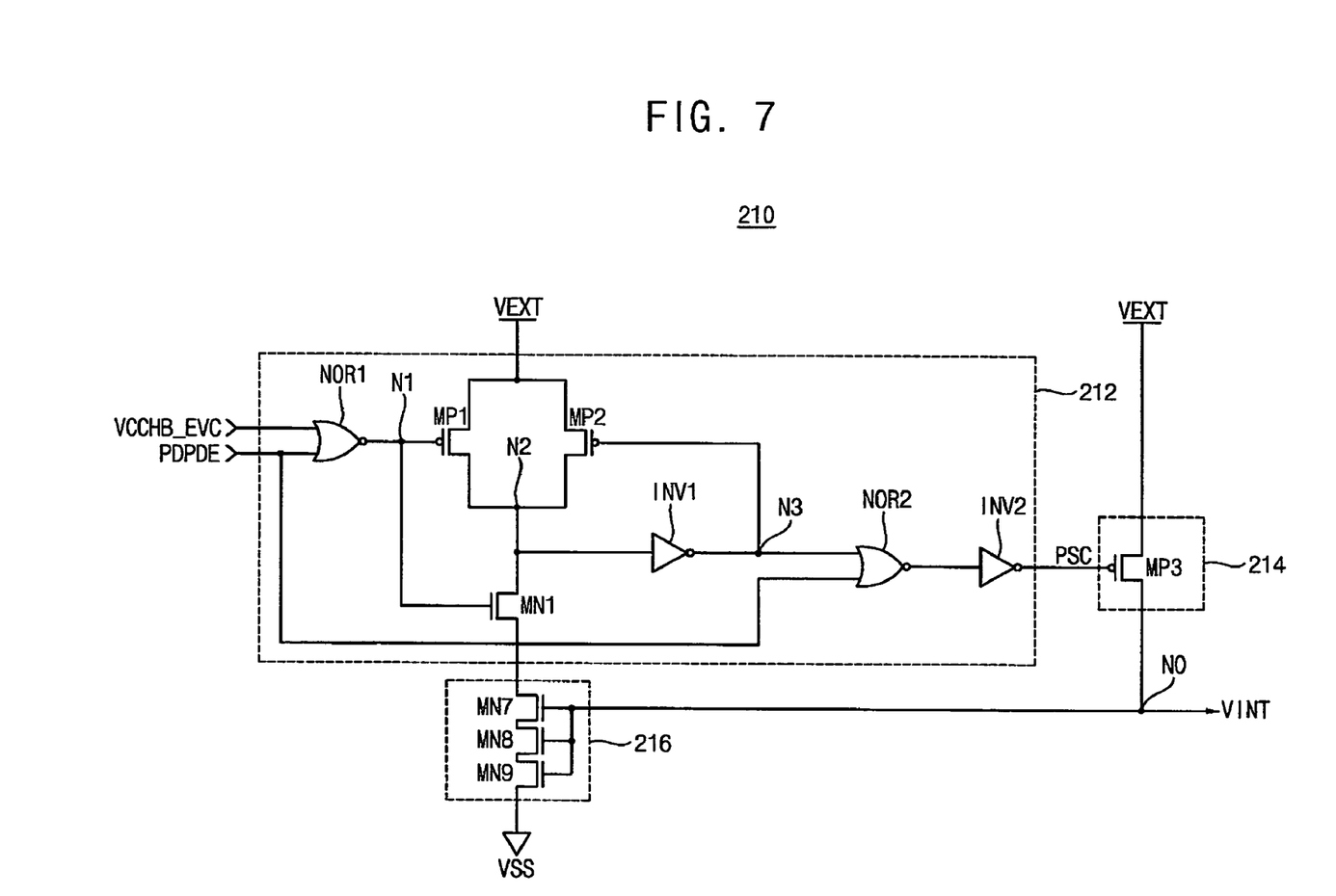
FIG. 7 is a circuit diagram illustrating another example of the internal power supply voltage pre-processing unit of FIG. 1.

FIG. 7 is a circuit diagram illustrating another example of the internal power supply voltage pre-processing unit of FIG. 1.

Referring to FIG. 7, an internal power supply voltage pre-processing unit 210 includes a switch control signal generating circuit 212, a feedback circuit 216 and a switching circuit 214.

The switching circuit 214 generates the internal power supply voltage VINT based on the external power supply voltage VEXT in response to a switch control signal PSC and provides the internal power supply voltage VINT to the node NO. The switch control signal generating circuit 212 generates the switch control signal PSC in response to an external initialization signal VCCHB_EVC and a DPD signal PDPDE, and is coupled to the switch control signal generating circuit 212 and operates in response to the internal power supply voltage VINT. The feedback circuit 216 determines a transition time of the internal power supply voltage VINT.

The switching circuit 214 may include a PMOS transistor MP3. The PMOS transistor MP3 includes a source to which the external power supply voltage VEXT is applied, a gate to which the switch control signal PSC is applied, and a drain coupled to the node NO.

The feedback circuit 216 may include NMOS transistors MN7, MN8 and MN9. The NMOS transistors MN7, MN8 and MN9 operate in response to the internal power supply voltage VINT, and the NMOS transistors MN7, MN8 and MN9 are coupled in series between the switch control signal generating circuit 212 and a ground voltage VSS.

The switch control signal generating circuit 212 may include NOR gates NOR1 and NOR2, PMOS transistors MP1 and MP2, an NMOS transistor MN1, and inverters INV1 and INV2.

The NOR gate NOR1 performs a NOR operation on the external initialization signal VCCHB_EVC and the DPD signal PDPDE. An output signal of the NOR gate NOR1 is provided to a node N1. The PMOS transistor MP1 includes a gate that is coupled to the node N1, a source to which the external power supply voltage VEXT is applied, and a drain that is coupled to the node N2. The NMOS transistor MN1 includes a gate that is coupled to the node N1, and a drain that is coupled to the node N2, and a source that is coupled to a drain of the NMOS transistor MN7. The NMOS transistor MN7 is included in the feedback circuit 216. The inverter INV1 inverts a signal of the node N2. An output signal of the inverter INV1 is provided to a node N3. The PMOS transistor MP2 includes a gate that is coupled to the node N3, a source to which the external power supply voltage VEXT is applied, and a drain that is coupled to the node N2. The NOR gate NOR2 performs a NOR operation on a signal of the node N3 and the DPD signal PDPDE. The inverter INV2 inverts an output signal of the NOR gate NOR2 to output the switch control signal PSC.

Hereinafter, the operation of the internal power supply voltage pre-processing unit 210 in FIG. 7 will be described.

A configuration of the internal power supply voltage pre-processing unit 210 in FIG. 7 is substantially similar to that of the internal power supply voltage pre-processor 110 in FIG. 2. A configuration of the feedback circuit 216 of FIG. 7 is different from that of the feedback circuit 116 in FIG. 2. A threshold voltage of the feedback circuit 216 is higher than that of the feedback circuit 116 because the feedback circuit 216 includes NMOS transistors NM7, NM8 and NM9, and the feedback circuit 116 includes only one NMOS transistor NM2. Therefore, the internal power supply voltage generating circuit 100 including the internal power supply voltage pre-processing unit 210 in FIG. 7 increases the transition time of the internal power supply voltage VINT and increases a pulse hold time of the internal initialization signal VCCHB_IVC.

Figure 8:
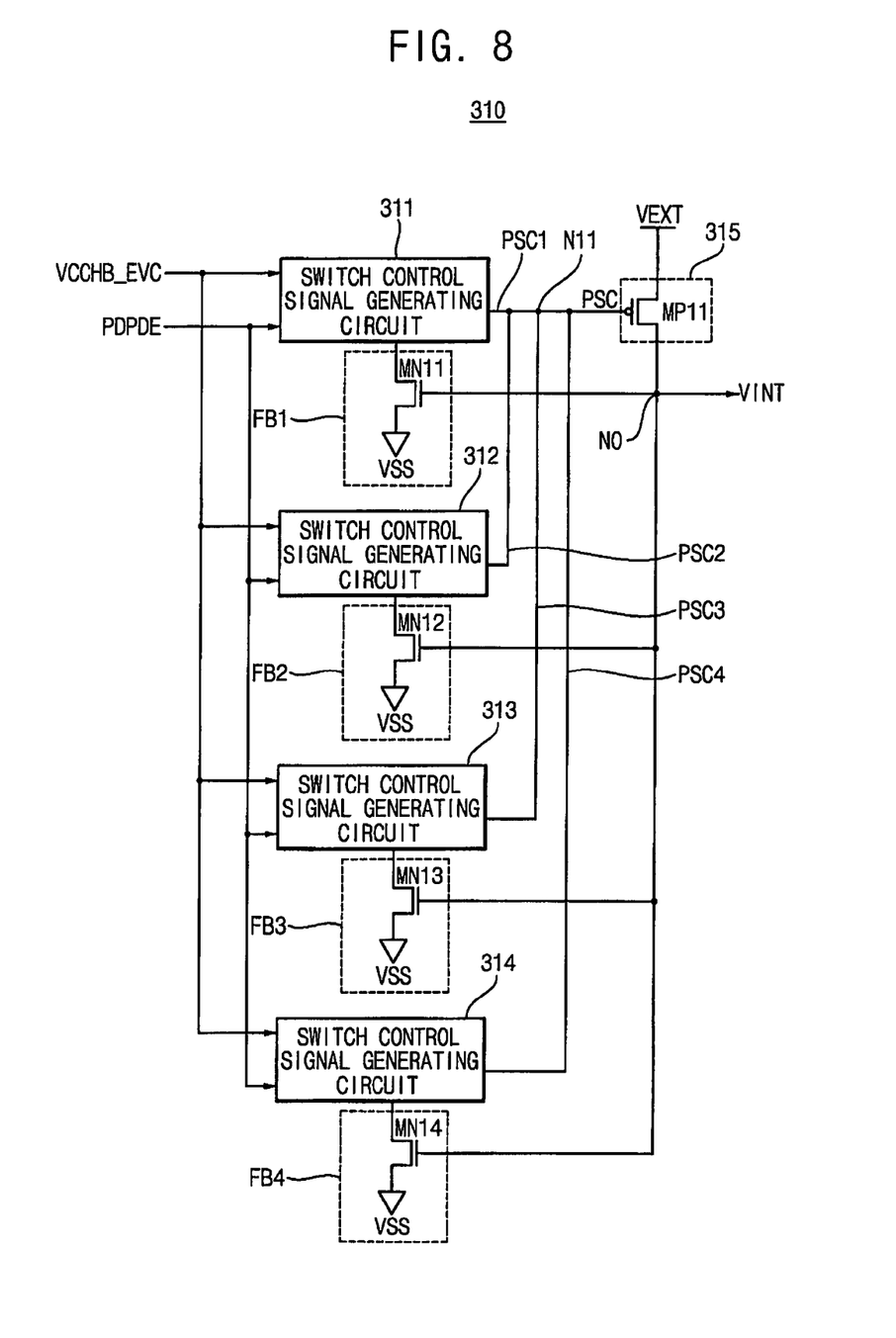
FIG. 8 is a circuit diagram illustrating still another example of the internal power supply voltage pre-processing unit of FIG. 1.
Figure 9A:
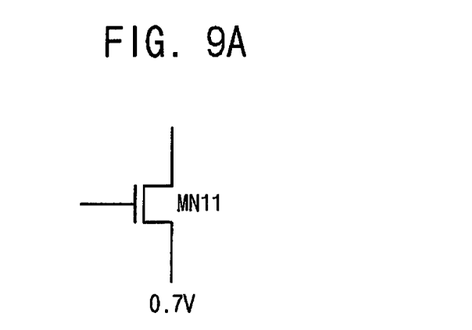
FIGS. 9A through 9D are diagrams respectively illustrating threshold voltages for the metal-oxide semiconductor (MOS) transistors of FIG. 8.
Figure 9B:
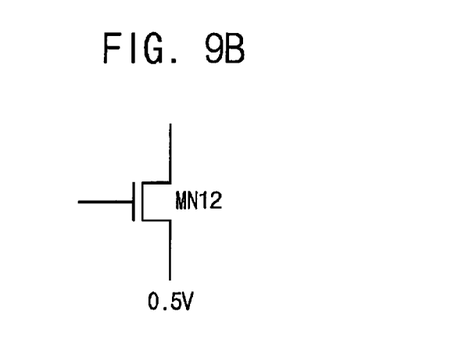
Figure 9C:
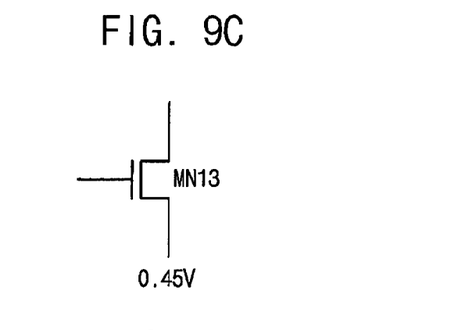
Figure 9D:
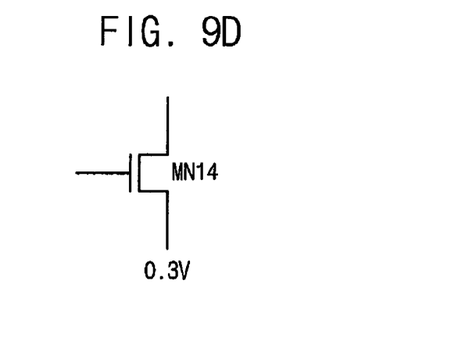

FIG. 8 is a circuit diagram illustrating still another example of the internal power supply voltage pre-processing unit in FIG. 1.

Referring to FIG. 8, an internal power supply voltage pre-processing unit 310 includes a switching circuit 315, switch control signal generating circuits 311, 312, 313 and 314, and feedback circuits FB1, FB2, FB3 and FB4.

The switching circuits 315 generates the internal power supply voltage VINT based on the external power supply voltage VEXT in response to a plurality of switch control signals PSC1, PSC2, PSC3 and PSC4. The switch control signal generators 311, 312, 313 and 314 respectively generate the switch control signals PSC1, PSC2, PSC3 and PSC4 in response to an external initialization signal VCCHB_EVC and a DPD signal PDPDE. The feedback circuits FB1, FB2, FB3 and FB4 are respectively coupled to the switch control signal generating circuits 311, 312, 313 and 314, and operate in response to the internal power supply voltage VINT. The feedback circuits FB1, FB2, FB3 and FB4 determine a transition time of the internal power supply voltage VINT.

The switching circuit 315 may include a PMOS transistor MP11. The PMOS transistor MP11 includes a source to which the external power supply voltage VEXT is applied, a gate to which the switch control signal PSC is applied, and a drain coupled to the node NO.

The feedback circuit FB1 may include an NMOS transistor MN11. The NMOS transistor MN11 includes a gate to which the internal power supply voltage VINT is applied, and a source to which ground voltage VSS is applied. The feedback circuit FB2 may include an NMOS transistor MN12. The NMOS transistor MN12 includes a gate to which the internal power supply voltage VINT is applied, and a source to which ground voltage VSS is applied. The feedback circuit FB3 may include an NMOS transistor MN13. The NMOS transistor MN13 includes a gate to which the internal power supply voltage VINT is applied, and a source to which ground voltage VSS is applied. The feedback circuit FB4 may include an NMOS transistor MN14. The NMOS transistor MN14 includes a gate to which the internal power supply voltage VINT is applied, and a source to which ground voltage VSS is applied.

FIGS. 9A through 9D are diagrams respectively illustrating threshold voltages of the MOS transistors MN11, MN12, MN13 and MN14 in FIG. 8.

Referring to FIGS. 9A through 9D, a threshold voltage of the NMOS transistor MN11 is about 0.7 V, a threshold voltage of the NMOS transistor MN12 is about 0.5 V, a threshold voltage of the NMOS transistor MN13 is about 0.45 V, and a threshold voltage of the NMOS transistor MN14 is about 0.3 V.

Figure 10:
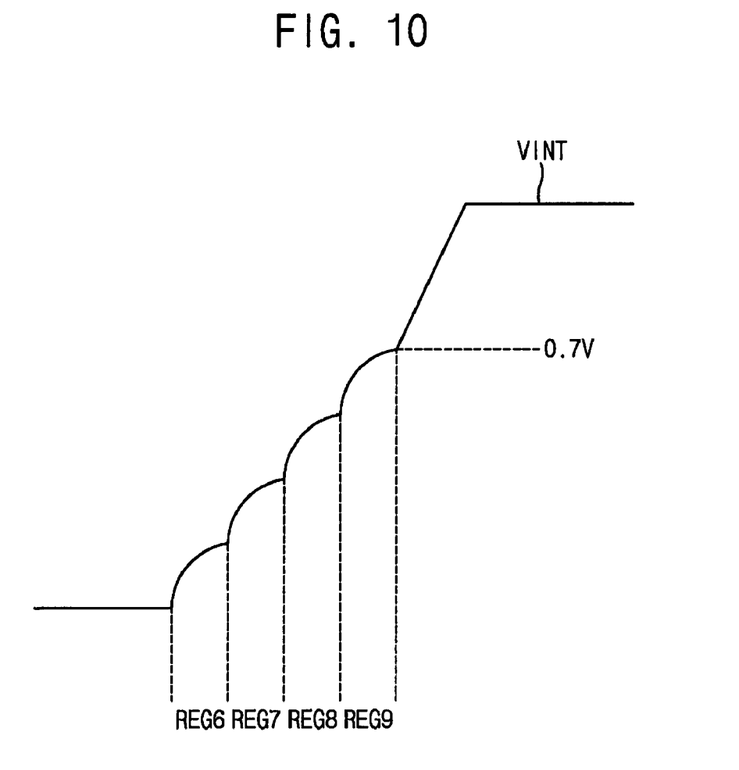
FIG. 10 is a diagram illustrating a voltage transition for the internal power supply voltage generated by the internal power supply voltage pre-processing unit of FIG. 8.

FIG. 10 is a diagram for illustrating a transition process of the internal power supply voltage VINT generated by the internal power supply voltage pre-processing unit in FIG. 8.

FIG. 10 illustrates the internal power supply voltage when the internal power supply voltage generating circuit 100 includes the internal power supply voltage pre-processing unit in FIG. 8 and the internal power supply voltage pre-processing unit includes four switch control signal generating circuits 311 through 314 and four feedback circuits FB1 through FB4.

The internal power supply voltage VINT generated by the internal power supply voltage generating circuit 100 has four saturation points from about 0 V to about 0.7 V, and the four saturation points are respectively generated because each of turn-on time points of the four feedback circuits FB1 through FB4 is different.

When the threshold voltage of the NMOS transistor MN11 is about 0.7 V, the internal power supply voltage VINT is increased to about 0.7 V by the internal power supply voltage pre-processing unit 310, and the internal power supply voltage VINT is increased from about 0.7 V to a saturation voltage by the internal power supply voltage generating unit 130.

A region REG6 is a section where the NMOS transistor MN14 of the feedback circuit FB4 is turned ON to generate a first saturation point. A region REG7 is a section where the NMOS transistor MN13 of the feedback circuit FB3 is turned ON to generate a second saturation point. A region REG8 is a section where the NMOS transistor MN12 of the feedback circuit FB2 is turned ON to generate a third saturation point. A region REG9 is a section where the NMOS transistor MN11 of the feedback circuit FB1 is turned ON to generate a fourth saturation point.

Hereinafter, with reference to FIGS. 8 through 10, the operation of the internal power supply voltage generating circuit 100 including the internal power supply voltage pre-processing unit 310 of FIG. 8 will be described.

As illustrated in FIG. 10, the internal power supply voltage pre-processing unit 310 of FIG. 8 includes the switch control signal generating circuits 311 through 314 and the feedback circuits FB1 through FB4 respectively coupled to the switch control signal generating circuits 311 through 314, and generates the internal power supply voltage VINT. The internal power supply voltage VINT includes saturation points corresponding to the number of the feedback circuits FB1 through FB4. That is, the internal power supply voltage VINT has the regions REG6, REG7, REG8 and REG9 that respectively correspond to durations when each of the NMOS transistors MN11 through MN14 of the feedback circuits FB1 through FB4 is turned ON. For example, each of the NMOS transistors MN11, MN12, MN13 and MN14 may have the threshold voltage in FIGS. 9A through 9D.

Therefore, the internal power supply voltage generating circuit may increase the transition time of the internal power supply voltage VINT and a pulse hold time of the internal initialization signal VCCHB_IVC.

Figure 11:
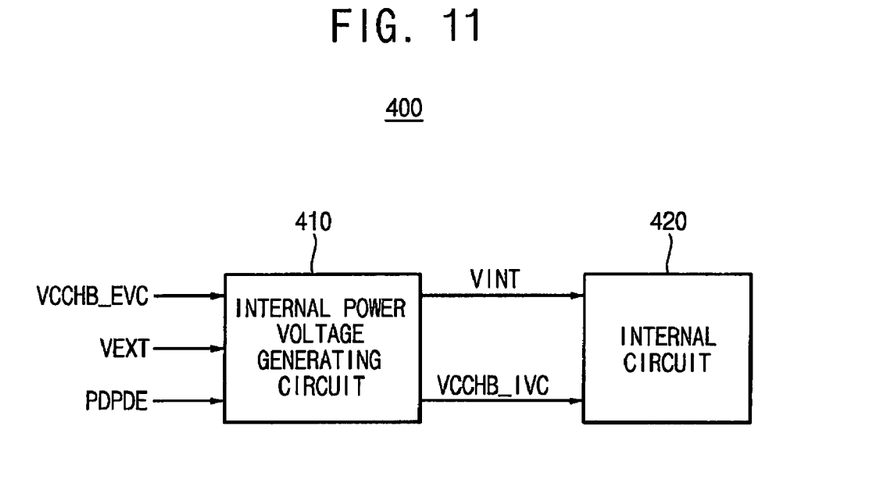
FIG. 11 is a general block diagram illustrating a semiconductor memory device including the circuit for generating the internal power supply voltage of FIG. 1 according to an embodiment of the invention.

FIG. 11 is a block diagram illustrating a semiconductor memory device including the circuit of generating the internal power supply voltage in FIG. 1 according to an example embodiment of the present invention.

Referring to FIG. 11, a semiconductor memory device 400 includes an internal power supply voltage generating circuit 410 and an internal circuit 420.

The internal power supply voltage generating circuit 410 generates an internal power supply voltage VINT in response to an external power supply voltage VEXT in a power-up mode and a DPD exit mode. The internal power supply voltage generating circuit 410 includes a feedback circuit. The feedback circuit operates in response to the internal power supply voltage VINT and determines a transition time of the internal power supply voltage VINT.

The internal circuit 420 operates based on the internal power supply voltage VINT. The internal power supply voltage generating circuit 410 generates the internal power supply voltage VINT and an internal initialization signal VCGHB_IVC in response to an external initialization signal VCCHB_EVC, the external power supply voltage VEXT and a DPD signal PDPDE, and the internal power supply voltage generating circuit 410 provides the internal power supply voltage VINT and the internal initialization signal VCCHB_IVC to the internal circuit 420. The internal circuit 420 is initialized in response to the internal initialization signal VCCHB_IVC, and operates by using the internal power supply voltage VINT as a power supply voltage.

As described above, the internal power supply voltage generating circuit according to an example embodiment of the present invention may control a hold time of an internal initialization signal by using a threshold voltage of a MOS transistor. Therefore, the internal power supply voltage generating circuit may completely reset logic circuits within an internal circuit in a power-up mode and a DPD mode.

Also, the internal power supply voltage generating circuit according to an example embodiment of the present invention may prevent generation of noise such as a surge current.

Having thus described example embodiments of the present invention, it is to be understood that the invention defined by the appended claims is not to be limited by particular details set forth in the above description as many apparent variations thereof are possible without departing from the scope thereof as hereinafter claimed.

What is claimed is:

1. A circuit generating an internal power supply voltage, comprising:
    an internal power supply voltage pre-processing unit that generates a first internal power supply voltage in response to an external power supply voltage in a power-up mode and a deep power-down (DPD) exit mode to provide the first internal power supply voltage to an output node, and further defines a transition time for the first internal power supply voltage;
    an internal power supply voltage generating unit that generates a stable second internal power supply voltage in response to the external power supply voltage to provide the second internal power supply voltage to the output node; and
    an initialization signal generating unit that generates an internal initialization signal in response to the first internal power supply voltage and the second internal power supply voltage,
    wherein the internal power supply voltage pre-processing unit comprises:
        a switching circuit that generates the first internal power supply voltage based on the external power supply voltage in response to a switch control signal;
        a switch control signal generating circuit that generates the switch control signal in response to an external initialization signal and a DPD signal; and
        a feedback circuit coupled to the switch control signal generating circuit, and responsive to the first internal power supply voltage to define the transition time of the first internal power supply voltage.

2. The circuit of claim 1, wherein the first and second internal power supply voltages are generated using the external power supply voltage in the power-up mode and the DPD exit mode.

3. The circuit of claim 1, wherein the feedback circuit includes a field effect transistor (FET) responsive to the first internal power supply voltage.

4. The circuit of claim 3, wherein the FET is a metal-oxide semiconductor (MOS) transistor.

5. The circuit of claim 4, wherein the transition time of the first internal power supply voltage is defined in relation to a threshold voltage of the MOS transistor.

6. The circuit of claim 5, wherein the transition time of the first internal power supply voltage is relatively short when the threshold voltage of the MOS transistor is low, and the transition time of the first internal power supply voltage is relatively long when the threshold voltage of the MOS transistor is high.

7. The circuit of claim 1, wherein the feedback circuit is further responsive to the first internal power supply voltage and includes a plurality of FETs coupled in series between the switch control signal generating unit and a low power supply voltage.

8. The circuit of claim 7, wherein a level of the first internal power supply voltage turning ON all of the plurality of the FETs is higher than that of the first internal power supply voltage turning ON one of the plurality of the FETs.

9. The circuit of claim 1, wherein the switch control signal generating unit comprises:
    a first NOR gate performing a NOR operation on the external initialization signal and the DPD signal and providing the NOR operation result to a first node;
    a first transistor of first conductivity type having an input terminal, a first output terminal, and a second output terminal, wherein the input terminal is coupled to the first node, the first output terminal receives the external power supply voltage, and the second output terminal is coupled to a second node;
    a second transistor of second conductivity type having an input terminal and a first output terminal, wherein the input terminal is coupled to the first node, the first output terminal is coupled to the second node;
    an inverter inverting a signal apparent at the second node;
    a third transistor of first conductivity type having an input terminal, a first output terminal and a second output terminal, wherein the input terminal is coupled to an output terminal of the inverter, the first output terminal receives the external power supply voltage, and the second output terminal is coupled to the second node; and
    a second NOR gate performing a NOR operation on a signal apparent at the output terminal of the inverter and the DPD signal to provide the switch control signal.

10. The circuit of claim 9, wherein the feedback circuit comprises:
    a fourth transistor having an input terminal, a first output terminal and a second output terminal, wherein the input terminal receives the first internal power supply voltage, the first output terminal is coupled to a second output terminal of the second transistor, and the second output terminal is coupled to a low power supply voltage.

11. The circuit of claim 10, wherein the first and third transistors are P-type MOS (PMOS) transistors, and the second and fourth transistors are N-type MOS (NMOS) transistors.

12. A circuit generating an internal power supply voltage, comprising:
    an internal power supply voltage pre-processing unit that generates a first internal power supply voltage in response to an external power supply voltage in a power-up mode and a deep power-down (DPD) exit mode to provide the first internal power supply voltage to an output node, and further defines a transition time for the first internal power supply voltage;
    an internal power supply voltage generating unit that generates a stable second internal power supply voltage in response to the external power supply voltage to provide the second internal power supply voltage to the output node; and
    an initialization signal generating unit that generates an internal initialization signal in response to the first internal power supply voltage and the second internal power supply voltage, wherein the internal power supply voltage pre-processing unit comprises:
  a switching circuit that generates the first internal power supply voltage from the external power supply voltage in response to a plurality of switch control signals;
  a plurality of switch control signal generating circuits that generates the plurality of the switch control signals in response to an external initialization signal and a DPD signal; and
  a plurality of feedback circuits that define a transition time for the first internal power supply voltage in response to the first internal voltage, wherein each one of the plurality of the feedback circuits is respectively coupled to the plurality of switch control signal generating circuits.

13. The circuit of claim 12, wherein each one of the plurality of feedback circuits comprises an FET responsive to the first internal power supply voltage.

14. The circuit of claim 13, wherein the FET is a MOS transistor.

15. The circuit of claim 14, wherein the respective MOS transistors in the respective ones of the plurality of feedback circuits have different threshold voltages.

16. The circuit of claim 15, wherein the transition time of the first internal power supply voltage is determined in relation to the threshold voltage of the respective MOS transistors.

17. The circuit of claim 16, wherein the respective MOS transistors are turned ON in an order arrangement from a MOS transistor having a lowest threshold voltage to a MOS transistor having a highest threshold voltage.

18. The circuit of claim 17, wherein a waveform for the internal power supply voltage during transition of the internal power supply voltage has multiple saturation points corresponding to the number of the respective MOS transistors.

19. The circuit of claim 12, wherein each of the switch control signal generating circuits comprises:
  a first NOR gate performing a NOR operation on the external initialization signal and the DPD signal and providing the NOR operation result to a first node;
  a first transistor of first conductivity type having an input terminal, a first output terminal and a second output terminal, wherein the input terminal is coupled to the first node, the first output terminal receives the external power supply voltage, and the second output terminal is coupled to a second node;
  a second transistor of second conductivity type having an input terminal and a first output terminal, wherein the input terminal is coupled to the first node, and the first output terminal is coupled to the second node;
  an inverter inverting a signal apparent at the second node;
  a third transistor of first conductivity type having an input terminal, a first output terminal and a second output terminal, wherein the input terminal is coupled to an output terminal of the inverter, the first output terminal receives the external power supply voltage, and the second output terminal is coupled to the second node; and
  a second NOR gate performs a NOR operation on a signal of the output terminal of the inverter and the DPD signal to provide the switch control signal.

20. The circuit of claim 19, wherein each one of the plurality of feedback circuits includes a fourth transistor having an input terminal, a first output terminal and a second output terminal, wherein the input terminal receives the first internal power supply voltage, the first output terminal is coupled to a second output terminal of the second transistor, and the second output terminal is coupled to a low power supply voltage.

21. A semiconductor memory device, comprising:
an internal power supply voltage generating circuit that generates an internal power supply voltage in response to an external power supply voltage in a power-up mode and a DPD exit mode and to operate in response to the internal power supply voltage, and further define defines a transition time for the internal power supply voltage, wherein the internal power supply voltage generating circuit comprises:
  an internal power supply voltage pre-processing unit that generates a first internal power supply voltage in response to an external power supply voltage in a power-up mode and a deep power-down (DPD) exit mode to provide the first internal power supply voltage to an output node, and further defines a transition time for the first internal power supply voltage;
  an internal power supply voltage generating unit that generates a stable second internal power supply voltage in response to the external power supply voltage to provide the second internal power supply voltage to the output node; and
  an initialization signal generating unit that generates an internal initialization signal in response to the first internal power supply voltage and the second internal power supply voltage; and
an internal circuit operable in relation to the internal power supply voltage,
wherein the internal power supply voltage pre-processing unit comprises:
  a switching circuit that generates the first internal power supply voltage based on the external power supply voltage in response to a switch control signal;
  a switch control signal generating circuit that generates the switch control signal in response to an external initialization signal and a DPD signal; and
  a feedback circuit coupled to the switch control signal generating circuit, and responsive to the first internal power supply voltage to define the transition time of the first internal power supply voltage.

22. A semiconductor memory device, comprising:
an internal power supply voltage generating circuit that generates an internal power supply voltage in response to an external power supply voltage in a power-up mode and a DPD exit mode and to operate in response to the internal power supply voltage, and further defines a transition time for the internal power supply voltage, wherein the internal power supply voltage generating circuit comprises:
  an internal power supply voltage pre-processing unit that generates a first internal power supply voltage in response to an external power supply voltage in a power-up mode and a deep power-down (DPD) exit mode to provide the first internal power supply voltage to an output node, and further defines a transition time for the first internal power supply voltage;
  an internal power supply voltage generating unit that generates a stable second internal power supply voltage in response to the external power supply voltage to provide the second internal power supply voltage to the output node; and
  an initialization signal generating unit that generates an internal initialization signal in response to the first internal power supply voltage and the second internal power supply voltage; and
an internal circuit operable in relation to the internal power supply voltage, wherein the internal power supply voltage pre-processing unit comprises:
a switching circuit generating the first internal power supply voltage in response to a plurality of switch control signals and the external power supply voltage;

a plurality of switch control signal generating circuits that generates the plurality of switch control signals in response to an external initialization signal and a DPD signal; and a plurality of feedback circuits that define the transition time of the first internal power supply voltage in response to the first internal power supply voltage, wherein each one of the plurality of feedback circuits is respectively coupled to one of the plurality of switch control signal generating circuits.

* * * * *